United States Patent [19]

Nakashima

[11] Patent Number: 5,258,669
[45] Date of Patent: Nov. 2, 1993

[54] CURRENT SENSE AMPLIFIER CIRCUIT

[75] Inventor: Yasuhiro Nakashima, Kanagawa, Japan

[73] Assignee: NEC Corporation, Tokyo, Japan

[21] Appl. No.: 838,190

[22] Filed: Feb. 18, 1992

[30] Foreign Application Priority Data

Feb. 15, 1991 [JP] Japan .................. 3-042981

[51] Int. Cl.⁵ .................... H03K 5/08; H03F 3/45
[52] U.S. Cl. .................... 307/530; 307/354; 307/362; 307/363; 307/562; 365/205; 365/207
[58] Field of Search ............... 307/530, 354, 362–363, 307/562; 365/205, 207

[56] References Cited

U.S. PATENT DOCUMENTS

| | | | |
|---|---|---|---|
| 4,962,482 | 10/1990 | Jinbo | 307/530 |
| 5,012,448 | 4/1991 | Matsuoka et al. | 307/530 |
| 5,056,063 | 10/1991 | Santin et al. | 307/530 |

Primary Examiner—Margaret R. Wambach
Attorney, Agent, or Firm—Whitham & Marhoefer

[57] ABSTRACT

Memory cells in the semiconductor memory section are supplied with a current from an N-channel transistor which is one of the components forming a current-mirror circuit through a column selector and also supplied with a current from another current passage formed by N-channel transistors connected in series between a power supply source and the column selector. The N-channel transistor is turned on for a predetermined short period of time in response to an externally supplied pulse only at the start of accessing to the memory cell. Thus, a parasitic capacitor coupled to a column line is charged quickly through two different current passages, whereby the time for accessing read-only memory cells is effectively shortened.

4 Claims, 5 Drawing Sheets

CURRENT SENSE AMPLIFIER CIRCUIT

BACKGROUND OF THE INVENTION

(1) Field of the Invention

The present invention relates to a sense amplifier circuit and, more particularly, to a current sense amplifier circuit for use in a semiconductor memory device.

(2) Description of the Related Art

A current sense amplifier circuit is usually used as a read or retrieve circuit, which is connected to a semiconductor memory section provided in a semiconductor memory device. More specifically, the current sense amplifier circuit judges whether there flows or not a very small current based on the storage information read out from the semiconductor memory section, and provides the result of such judgment as an output correspondence to an electric level of "1" or "0".

FIG. 1 is a circuit diagram showing a prior art current sense amplifier circuit, FIG. 2 is a waveform chart illustrating the operation of the prior art circuit in the case where a current flows when the semiconductor memory section is accessed, and FIG. 3 is a waveform chart illustrating the operation of the same prior art circuit in the case where no currents flow when the semiconductor memory section is accessed.

The current sense amplifier circuit, as shown in FIG. 1, is a subordinate circuit connected to a semiconductor memory section which includes an N-channel selecting transistor 5 (hereinafter referred to as a "Y-selector"), N-channel access transistors 6, 7, and a parasitic capacitor 9. The line connecting the source of the Y-selector 5 with the respective drains of the access transistors 6, 7 and including a node C to which the parasitic capacitor 9 is coupled is hereinafter referred to as a "digit line or column line C".

The current sense amplifier circuit forms a current mirror circuit. More specifically, the current sense amplifier circuit comprises P-channel transistors 1 and 2; a complimentary inverter 8; an N-channel transistor 3 receiving as a gate input the output signal of the complementary inverter 8 and having a source connected to the input terminal of the complementary inverter 8 and also to the drain side B of the Y-selector 5 and a drain connected to the drain side A of the P-channel transistor 1; and an N-channel transistor 4 constituting with the P-channel transistor 2 a ratio inverter.

Next, the operation of the circuit will be explained with reference to the graph shown in FIG. 2.

When a high level input is inputted on input terminals (row lines) A1 and A3 at an instant t1 as shown in FIG. 2, the N-channel transistor 7 in the semiconductor memory section is selected. Thus, the N-channel transistor 7 and the Y-selector 5 both are turned on.

As shown in FIG. 2, the potential levels at the respective nodes are as follows. The potential at the node B momentarily becomes lower than the inversion level (threshold level) of the complementary inverter 8 in charging a parasitic capacitor 9 coupled to the digit line C. After the completion of charging of the parasitic capacitor 9, as the N-channel transistor 7 remains at its "on" state, the node B connected with the drain of the Y-selector 5 assumes a level slightly lower than the inversion level of the complementary inverter 8.

The potential at the node A change in such a manner that it follows the potential at the node B. That is, during the charging of the parasitic capacitor 9 of the digit line C, the potential at the node A becomes lower than the "$V_{DD}$-threshold level of the P-channel transistor". Here, the $V_{DD}$ represents the potential of the power supply source. After the completion of charging of the capacitor 9, it becomes slightly lower than the "$V_{DD}$-threshold level of the P-channel transistor" and thus the P-channel transistors 1 and 2 are turned on.

Generally, the potential level at a node D, that is, an output node of the sense amplifier circuit is varied according to the ratio between the transconductance of the P-channel transistor 2 (hereinafter referred to as "gmP") and the transconductance of the N-channel transistor 4 (hereinafter referred to as "gmN"). The transistors 2, 4 forming the ratio inverter are so designed that the level at the output node D takes a high level when the gmP is higher than the gmN. Thus, while the P-channel transistor 2 is in its on-state, as the gmP is larger than the gmN, a high level output is provided at the output node D.

In the case where a high level input is inputted on the input terminals A1 and A2 at an instant t2, as shown in FIG. 3, the N-channel transistor 6 in the semiconductor memory section is selected. However, the transistor 6 remains "off" at this time. This equivalently means that the N-channel transistor 6 is not provided. Thus, only the Y-selector 5 is turned on.

As also shown in FIG. 3, the potential at the node B thus momentarily becomes lower than the inversion level of the complementary inverter 8 in charging the parasitic capacitor 9 of the digit line C, and after the completion of charging of the parasitic capacitor 9 it becomes slightly higher than the inversion level of the complementary inverter 8.

The level at the node A follows that at the node B. That is, during the period of charging of the parasitic capacitor 9, the level at the node A becomes lower than the "$V_{DD}$-threshold level of P-channel transistor", and there is established a relation such that the gmP is larger than the gmN because the P-channel transistors 1, 2 are in their on-states. Thus, during the charging of the parasitic capacitor 9 of the digit line C, the current sense amplifier circuit provides a high level output at the output node D.

After the charging of the parasitic capacitor 9 coupled to the digit line C, the node A assumes a level in the neighborhood of the "$V_{DD}$-threshold level of P-channel transistor". Thus, the transconductance of each of the P-channel transistors 1 and 2 is reduced, so that the gmN becomes larger than the gmP. The current sense amplifier circuit thus provides a low level output at the output node D.

In the conventional current sense amplifier circuit, when the selection was made on the portion where an N-channel transistor (hereinafter referred to as "memory cell") is not formed in the semiconductor memory section, the output of the current sense amplifier circuit becomes momentarily a high level for charging the parasitic capacitor coupled to the digit line. While the capacitor coupled to the digit line is being charged, the output remains a high level, and after the completion of the charging, the current sense amplifier circuit becomes a condition wherein a normal low level is outputted. While the output of the current sense amplifier circuit stays at its high level, the output data is invalid, thus extending the access time (shown as "TAC2" in FIG. 3) in the semiconductor memory device. This is one problem to be solved in the conventional circuit.

Recently, with an increase in the memory capacity, there is an increase in the number of memory cells coupled to the digit line in the digit line direction. This means that there is a tendency to increase the charging period of the digit line, that is, the duration TAC2 in FIG. 3 increases in accordance with an increase in the memory capacity.

Further, in the conventional circuit, the gate potential of the N-channel transistor 3 is in the neighborhood of an intermediate level between the power supply potential and the ground potential. Therefore, the transconductance of the N-channel transistor 3 is low, and thus it is impossible to charge the parasitic capacitor 9 quickly by supplying a large current I1 to the digit line C. In addition, since the gate potential of the P-channel transistor 1 of the current-mirror circuit is an intermediate level between the "power supply potential-threshold level of P-channel transistor" and the ground potential, the transconductance of the P-channel transistor 1 is also low. This means that the current I1 for charging the parasitic capacitor 9 coupled to the digit line C is small, thus further extending the access time TAC2. This is another problem to be solved in the conventional circuit.

SUMMARY OF THE INVENTION

It is, therefore, a primary object of the invention to overcome the problems existing in the conventional circuit and to provide an improved current sense amplifier circuit which permits far faster charging of the parasitic capacitor so that the access time and hence the time for reading out the data is affectively reduced.

To attain the above object of the invention, there is provided a current sense amplifier circuit connected through a column selector to a read-only memory cell array, which comprises:

a first P-channel transistor having a source connected to a power supply source and a gate connected to a drain thereof;

a second P-channel transistor having a source connected to the power supply source, a gate connected to the drain of the first P-channel transistor and a drain connected to an output terminal of the current sense amplifier circuit;

a first N-channel transistor having a drain connected to the drain of the second P-channel transistor, a gate connected to a reference voltage source, and a source grounded;

a second N-channel transistor having a drain connected to the drain of the first P-channel transistor and a source connected to the column selector;

a complementary inverter connected between the source and gate of the second N-channel transistor, the inverter receiving an input voltage to the column selector and controlling the gate of the second N-channel transistor;

a third N-channel transistor having a drain connected to the power supply source and a gate connected to the output terminal of the complementary inverter; and a fourth N-channel transistor having a drain connected to a source of the third N-channel transistor, a gate connected to an input terminal to which an external pulse signal is supplied, and a source connected to the column selector.

The externally supplied pulse signal noted above causes the fourth N-channel transistor to be "on" for a fixed period of time at the start of accessing to the read-only memory cell.

According to another aspect of the invention, the current sense amplifier circuit may further comprise a one-shot pulse generator connected between the column selector and the pulse input terminal, for detecting a change in the input voltage applied to the column selector and generating the pulse signal.

When the read-only memory cell is accessed, the array is supplied with currents not only from the second N-channel transistor through the column selector but also from the fourth N-channel transistor. Thus, the parasitic capacitor can be charged quickly, thereby permitting the reduction of the access time and the time for reading out of the storage data.

BRIEF DESCRIPTION OF THE DRAWINGS

The above and other objects, features and advantages of the invention will become more apparent from the following description when the same is read with reference to the accompanying drawings, in which.

PREFERRED EMBODIMENTS OF THE INVENTION

Figure 1:
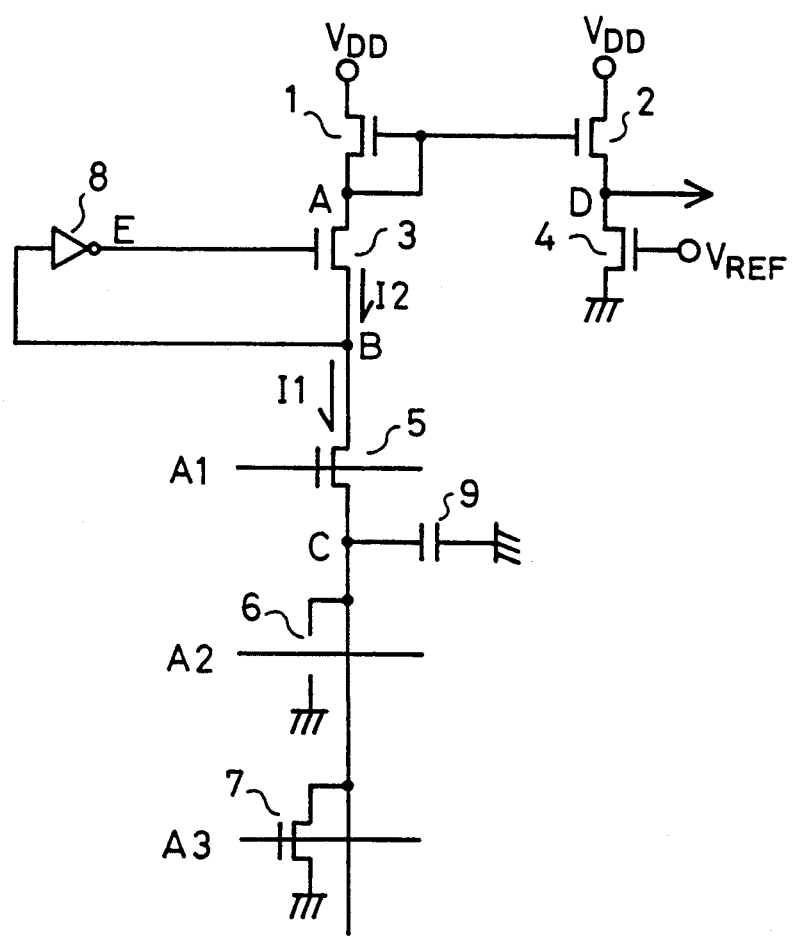
FIG. 1 is a circuit diagram showing a prior art current sense amplifier circuit.
Figure 2:
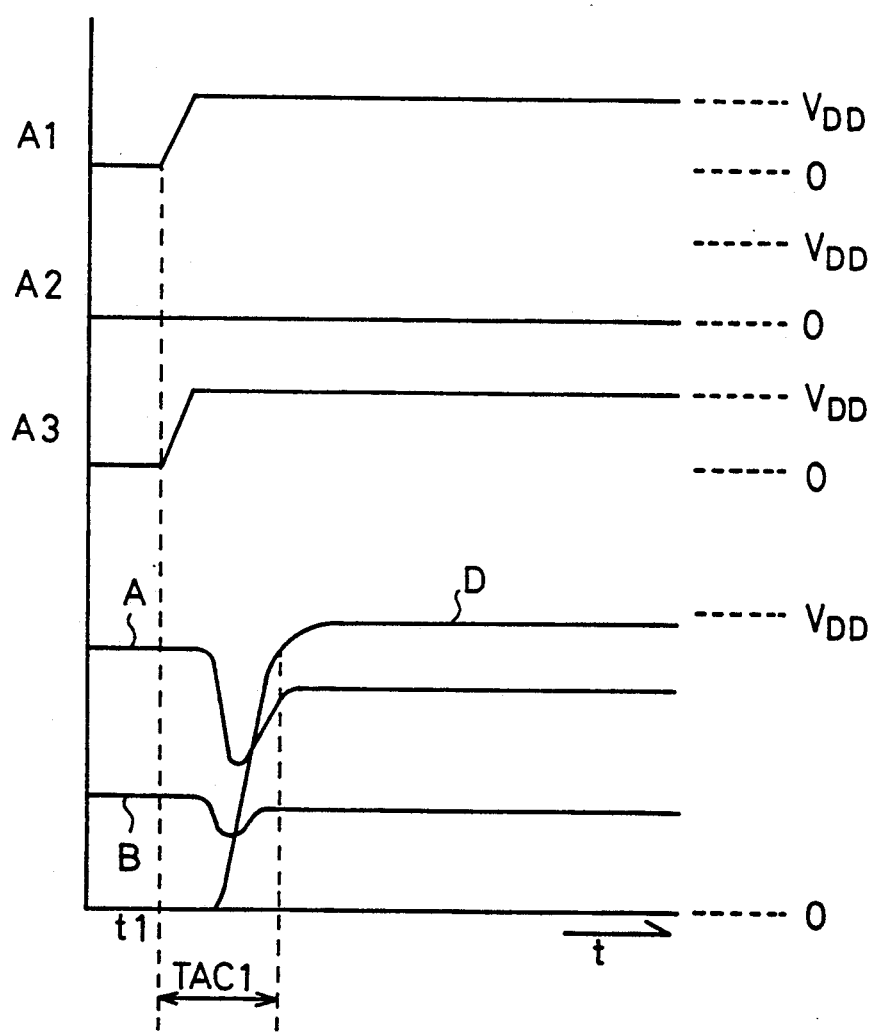
FIG. 2 is a waveform chart for explaining the operation of the prior art circuit when a memory cell with a current path is selected.

Now, preferred embodiments of the invention will be explained with reference to the accompanying drawings. It should be noted that, throughout the explanation, the same or like reference numerals or symbols refer to the same or like elements in all the figures of the drawings.

Figure 4:
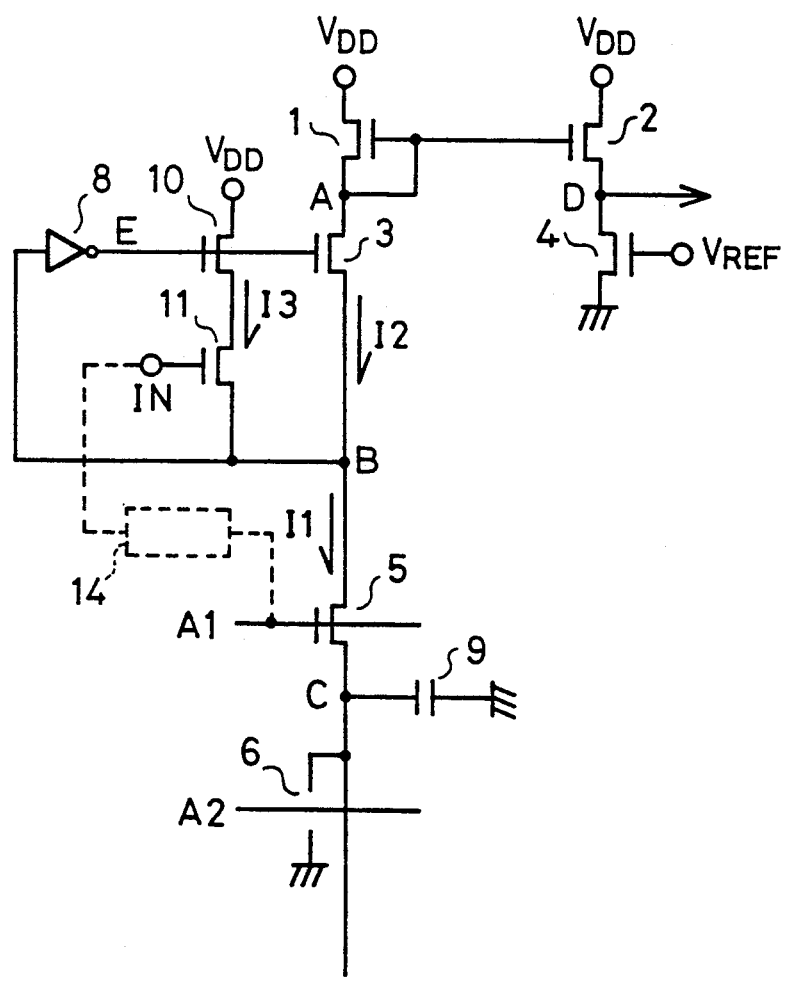
FIG. 4 is a circuit diagram showing an embodiment of the current sense amplifier circuit according to the invention.
Figure 5:
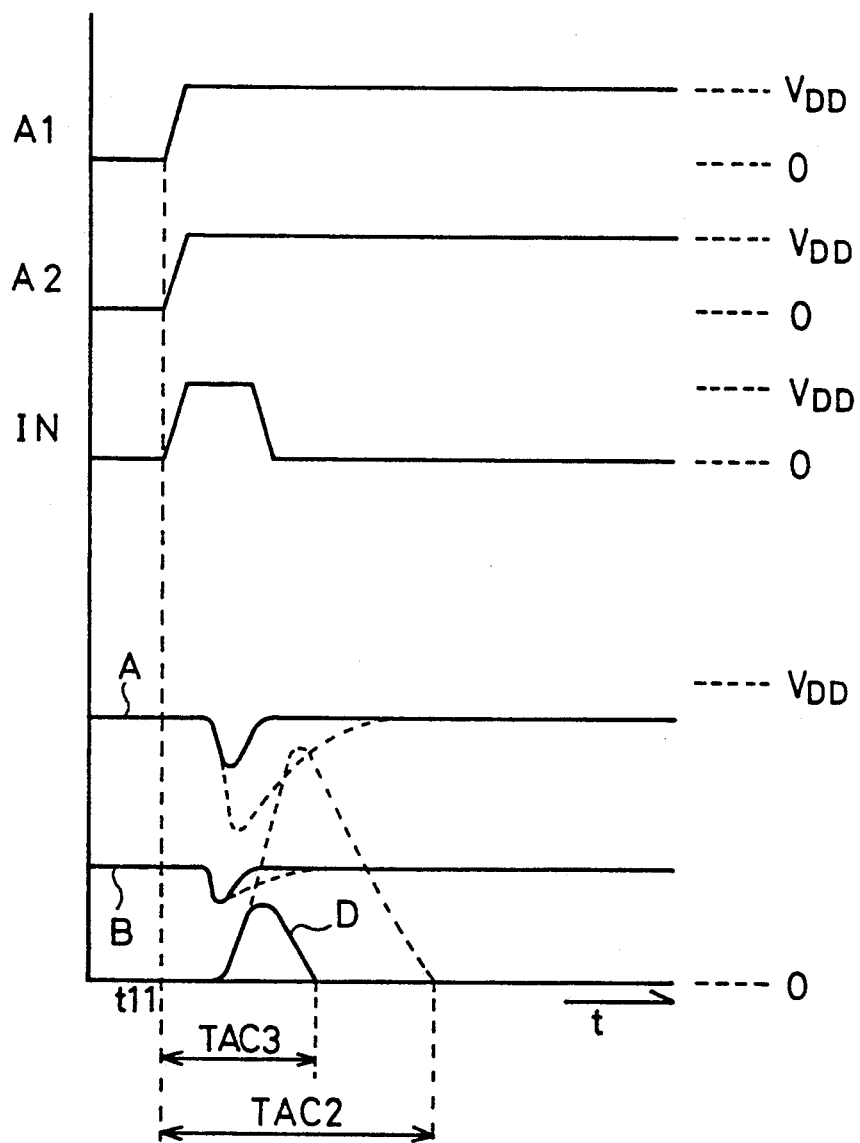
FIG. 5 is a waveform chart for explaining the operation of the current sense amplifier circuit of the invention shown in FIG. 4.

FIG. 4 is a circuit diagram showing an embodiment of the current sense amplifier circuit according to the invention, and FIG. 5 is a waveform chart for explaining the operation of the same circuit when a memory cell without a current path in a semiconductor memory section is selected. In FIG. 5, solid plots illustrate the operation of the embodiment of the invention and dashed plots illustrate the operation of the prior art circuit for a comparison purpose.

The circuit of the embodiment is different from the prior art example shown in FIG. 1 in that it further comprises an input terminal IN and two N-channel transistors 10, 11 provided as additional components. To the input terminal IN is supplied a pulse signal. The N-channel transistor 10 has a drain connected to the power supply source $V_{DD}$, and a gate connected to the output terminal of the complementary inverter 8 so as to receive the output signal of the complementary inverter 8. The other N-channel transistor 11 has a drain connected to the source of the N-channel transistor 10, and a source connected to the junction node B and also to the input terminal of the complementary inverter 8. The remaining parts of the embodiment are the same as those in the prior art circuit and are designated by the same reference numerals and symbols.

In this embodiment, the potemtial at the output node D is at a high level when the transconductance of the P-channel transistor 2 (hereinafter referred to as "gmP1") is larger than the transconductance of the N-channel transistor 4 (hereinafter referred to as "gmN1"), and it is at a low level when the gmP1 is smaller than the gmN1.

The actual operation of this current sense amplifier circuit will now be described with reference to the timing chart of FIG. 5.

Simultaneously with the changes of the input signals A1, A2 from low to high levels at an instant t11, an input signal IN is set to a high level for a moment. At this time, the potential at the junction node B becomes low for charging the parasitic capacitor 9 coupled to the digit line C, and thus the output E of the complementary inverter 8 becomes high.

The N-channel transistors 3 and 10, to both of which the output E of the complementary inverter 8 is supplied, are turned on accordingly. With the turning-on of the N-channel transistor 3, the current I2 charges the parasitic capacitor 9 of the digit line C. It should be noted that, with the turning-on of the N-channel transistor 10, the current I3 is supplied to the digit line C for charging the parasitic capacitor 9. That is, in this embodiment, the current I1 flowing to the digit line C for charging the parasitic capacitor 9 is the sum of the above currents I2 and I3.

Figure 3:
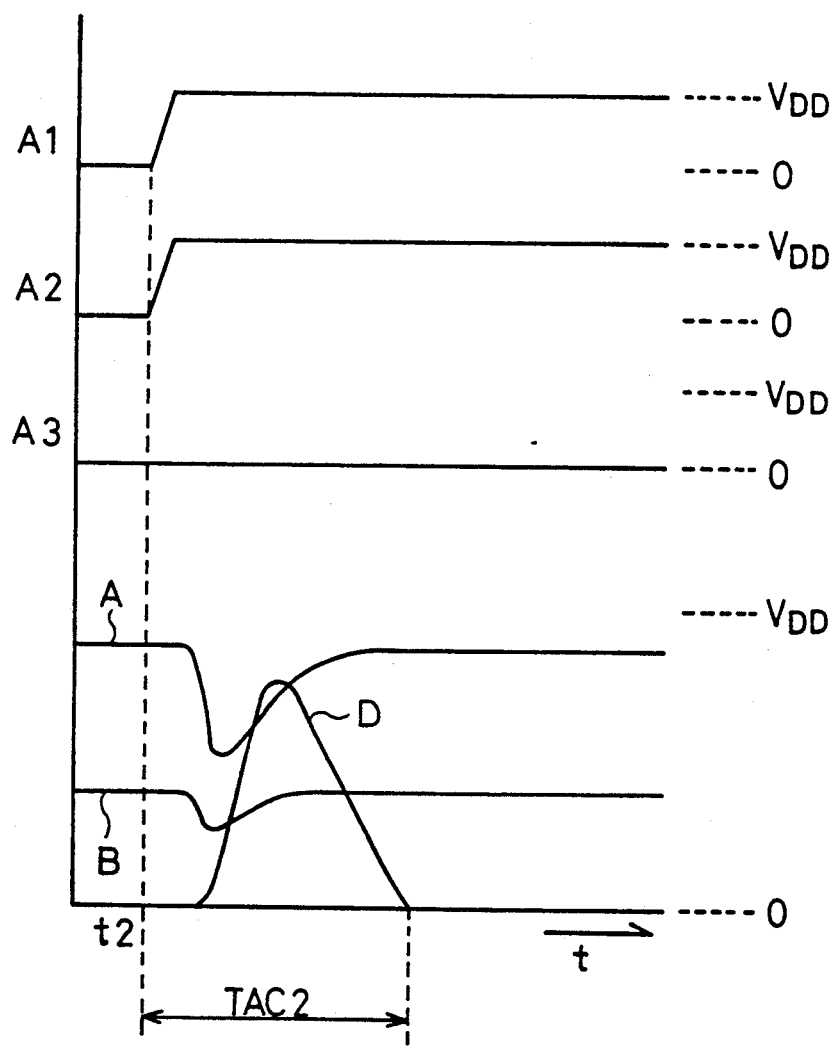
FIG. 3 is a waveform chart for explaining the operation of the prior art circuit when a memory cell without a current path is selected.

In the conventional current sense amplifier circuit as shown in FIG. 3, the sole current I2 constitutes the current I1 supplied to the digit line C for charging the parasitic capacitor 9. To the contrary, in this embodiment, the current I3 is used in addition to the current I2 for charging the parasitic capacitor 9. This contributes in reducing the time for charging the parasitic capacitor 9. Thus, although the potentials at the nodes A and B momentarily assume low levels in response to the inversion of the input signals A1, A2 from the low to the high levels, they are restored to the initial high levels quickly because the parasitic capacitor 9 coupled to the digit line C is charged quickly.

Further, the transconductance of the P-channel transistors 1, 2 is low, and the gmP1 of the P-channel transistor 2 is smaller than the gmN1 of the N-channel transistor 4, and thus the current sense amplifier circuit provides a low level output quickly from its output terminal D.

Likewise, when a memory cell having a current path in the semiconductor memory section is selected, the input signal IN is caused to assume a high level momentarily so as to effect quick charging of the parasitic capacitor 9 coupled to the digit line C. When the input signal IN is inverted from the high to the low level, the memory cell has already been in an operative state, and the digit line C is quickly inverted to the low level and accordingly the potential at the output node D of the current sense amplifier circuit becomes a high level.

In the above embodiment, the explanation has been made on the assumption that the input signal IN is an externally supplied pulse signal. Alternatively, a one-shot pulse may be generated based on the detection of the rising of the gate signal applied to the Y-selector 5 and used as the input signal IN. Such one-shot pulse generator is shown by a dotted line with a reference numeral 14 in FIG. 4. Further, while the memory cells of the semiconductor memory section were constituted by N-channel transistors, the invention is also applicable to a semiconductor device in which such memory cells are constituted by P-channel transistors.

In the above example, the P-channel transistors 1 and 2 correspond respectively to a first and a second P-channel transistor, and the N-channel transistors 4, 3, 10 and 11 correspond respectively to a first to a fourth N-channel transistor referred to in the appended claims.

As has been described in the foregoing, according to the invention, a first and a second N-channel transistor are provided in a current sense amplifier circuit in a semiconductor integrated circuit, with the second N-channel transistor being adapted to receive a pulse signal at the gate. Thus, the parasitic capacitor can be charged far quickly as compared to the prior art current sense amplifier circuit, thus permitting reduction of the time for reading out of the storage data.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. A current sense amplifier circuit connected through a column selector to a read-only memory cell array, said circuit comprising:
   a first P-channel transistor having a source connected to a power supply source and a gate connected to a drain thereof;
   a second P-channel transistor having a source connected to said power supply source, a gate connected to the drain of said first P-channel transistor and a drain connected to an output terminal of said current sense amplifier circuit;
   a first N-channel transistor having a drain connected to the drain of said second P-channel transistor, a gate connected to a reference voltage source, and a source grounded;
   a second N-channel transistor having a drain connected to the drain of said first P-channel transistor and a source connected to said column selector;
   a complementary inverter connected between the source and gate of said second N-channel transistor, said inverter receiving an input voltage to said column selector and controlling the gate of said second N-channel transistor;
   a third N-channel transistor having a drain connected to the power supply source and a gate connected to the output terminal of said complementary inverter; and
   a fourth N-channel transistor having a drain connected to a source of said third N-channel transistor, a gate connected to an input terminal to which a pulse signal is supplied, and a source connected to said column selector.

2. A current sense amplifier circuit according to claim 1, wherein said input terminal receives said pulse signal for causing said fourth N-channel transistor to be "on" for a fixed period of time at the start of accessing to said read-only memory cell.

3. A current sense amplifier circuit according to claim 1, further comprising a one-shot pulse generator connected between said column selector and said pulse input terminal, for detecting a change in said input voltage to said column selector and generating said pulse signal.

4. A current sense amplifier circuit according to claim 1, in which said second P-channel transistor and said first N-channel transistor constitutes a ratio inverter whose output potential at said output terminal is determined by a transconductance ratio between said second P-channel transistor and said first N-channel transistor.

* * * * *